(12) United States Patent
Zhang et al.

(10) Patent No.: US 9,087,788 B2
(45) Date of Patent: Jul. 21, 2015

(54) SHALLOW TRENCH AND FABRICATION METHOD

(71) Applicant: Semiconductor Manufacturing International (Shanghai) Corporation, Shanghai (CN)

(72) Inventors: Haiyang Zhang, Shanghai (CN); Dongjiang Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/055,899

(22) Filed: Oct. 17, 2013

(65) Prior Publication Data

US 2014/0332932 A1   Nov. 13, 2014

(30) Foreign Application Priority Data

May 9, 2013  (CN) .......................... 2013 1 0170494

(51) Int. Cl.
| | |
|---|---|
| *H01L 21/3065* | (2006.01) |
| *H01L 21/308* | (2006.01) |
| *H01L 29/06* | (2006.01) |

(52) U.S. Cl.
CPC .......... *H01L 21/3065* (2013.01); *H01L 21/308* (2013.01); *H01L 29/0657* (2013.01)

(58) Field of Classification Search
CPC ................... H01L 21/3065; H01L 21/30655; H01L 21/30621; H01L 21/31116; H01L 21/31138
USPC ........................... 257/622; 438/711–714, 734
See application file for complete search history.

(56) References Cited

U.S. PATENT DOCUMENTS

| | | | |
|---|---|---|---|
| 6,180,533 B1 * | 1/2001 | Jain et al. ....................... | 438/714 |
| 6,187,685 B1 * | 2/2001 | Hopkins et al. ............... | 438/710 |
| 2008/0286979 A1 * | 11/2008 | Shin et al. ..................... | 438/714 |
| 2012/0088371 A1 * | 4/2012 | Ranjan et al. ................. | 438/711 |

* cited by examiner

*Primary Examiner* — Fernando L Toledo
*Assistant Examiner* — Christine C Lau
(74) *Attorney, Agent, or Firm* — Anova Law Group, PLLC (57) ABSTRACT

Various embodiments provide shallow trenches and fabrication methods. In an exemplary method, a semiconductor substrate can be provided. A mask layer can be provided on the semiconductor substrate. An etch-cleaning process can be performed. The etch-cleaning process can include etching the semiconductor substrate to form a shallow trench by one or more etching steps using the mask layer as an etch mask. The etch-cleaning process can further include performing a plasma cleaning process after each of the one or more etching steps. The plasma cleaning process can use a plasma that is electronegative.

18 Claims, 11 Drawing Sheets

SHALLOW TRENCH AND FABRICATION METHOD

CROSS-REFERENCES TO RELATED APPLICATIONS

This application claims priority to Chinese Patent Application No. CN201310170494.3, filed on May 9, 2013, the entire contents of which are incorporated herein by reference.

FIELD OF THE DISCLOSURE

The present disclosure relates to the field of semiconductor technology and, more particularly, relates to shallow trenches and fabrication methods thereof.

BACKGROUND

With developments of integrated circuit (IC) fabrication technology, critical dimensions (CD) of an IC device have decreased continuously. As semiconductor devices become more tightly arranged, requirements for electrical isolation between active regions and devices have correspondingly become more stringent.

In existing electrical isolation technology, shallow trench isolation (STI) structures have advantages including small isolation area, super latch-up protecting ability, almost-zero field corrosion, very small active region tilt angle, beneficial for one-step process, etc. Thus, as microelectronic processes enter deep-sub-micron stage, the STI structures are the most commonly-used electrical isolation structures.

An existing process for forming STI structures includes the following steps. First, a photo mask is formed on a semiconductor substrate. Next, using the photo mask as an etch mask, the semiconductor substrate is etched to form a trench. Finally, the trench is filled with an insulative material to form the STI structure.

In the STI forming process, a dry etching process is the most commonly-used process. The dry etching process can result in an anisotropic etch profile, and may have desired sidewall profile control and CD control. A trench formed by the dry etching process can have a desired trench structure. An etching effect of the dry etching process is achieved by chemical actions, physical actions or a combination of both.

The dry etching process usually includes the following steps. First, an etching gas is excited into a plasma by a high-frequency electric field. Next, for chemical actions, the plasma generates reactive elements including free radicals and reactive atoms. For physical actions, the plasma generates energetic ions including positive ions. The reactive elements can react with the semiconductor substrate, and etch the semiconductor substrate. The energetic ions can be accelerated by an electric field vertical to a surface of the semiconductor substrate to bombard the semiconductor substrate, and remove a surface material of the semiconductor substrate using sputtering etch.

In the dry etching process, reactive elements or energetic ions generated by the plasma can react with the semiconductor substrate to form the trench. At the same time, a large amount of by-products are produced. These by-products adsorb a large amount of charged particles, and attach to inner walls of the trench, which can affect insulation properties of the subsequent-formed shallow trench. Therefore, during the dry etching process, inert gases are supplied and circulated in order to remove the by-products gathered on the trench surface and on a bottom surface of the semiconductor substrate.

With developments of semiconductor technology, an aspect ratio of the shallow trench formed in the semiconductor substrate has gradually increased. Thus, it has become increasingly difficult to clean up the by-products on the inner walls of the shallow trench. Existing cleaning process usually cannot effectively clean up the by-products inside the shallow trench, which can lead to defective electrical isolation of the subsequently-formed STI structure.

BRIEF SUMMARY OF THE DISCLOSURE

One aspect of the present disclosure includes a method for forming a shallow trench. A semiconductor substrate can be provided. A mask layer can be provided on the semiconductor substrate. An etch-cleaning process can be performed. The etch-cleaning process can include etching the semiconductor substrate to form a shallow trench by one or more etching steps using the mask layer as an etch mask. The etch-cleaning process can further include performing a plasma cleaning process after each of the one or more etching steps. The plasma cleaning process can use a plasma that is electronegative.

Another aspect of the present disclosure includes a semiconductor device. The semiconductor device can include a semiconductor substrate including a shallow trench formed in the semiconductor substrate. The shallow trench can be formed by an etch-cleaning process. The etch-cleaning process can include etching the semiconductor substrate to form the shallow trench by one or more etching steps using a mask layer as an etch mask. The etch-cleaning process can further include performing a plasma cleaning process after each of the one or more etching steps. The plasma cleaning process can use a plasma that is electronegative.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In a dry etching process, an etching gas can be excited into a plasma gas, by a high-frequency electric field. The plasma can also be referred to as an etching plasma. By setting a bias voltage at a surface of a semiconductor substrate or other suitable methods, an electric field vertical to the surface of the semiconductor substrate (e.g. a silicon wafer) can be established in order to guide the plasma gas to bombard and/or corrode the silicon wafer under acceleration. Thus, a shallow trench with smoother slope(s) and a better directionality can be formed.

However, in the dry etching process, under the effect of the electric field established in a reaction chamber, positive ions in the plasma gas tend to gather at a bottom of the shallow trench, and negatively charged ions and/or electrons tend to gather at a top of the shallow trench. A large amount of charged particles can attach to by-products produced during etching, and the by-products can be adsorbed onto sidewall(s) and bottom of the formed shallow trench.

In addition, as the aspect ratio (i.e., a depth/width ratio) of the shallow trench increases during semiconductor fabrication processes, the by-products having attached charged particles can be firmly adsorbed in the shallow trench. This can increase difficulty for exhaust system in removing the by-products and may lead to potential electrical leakage risks in a subsequently-formed STI structure. As disclosed herein, the terms "STI structure" and STI can be used interchangeably in the present disclosure.

Further, because of repulsion between charged particles of a same polarity (e.g., electrons), the positive ions gathered at the bottom of the formed shallow trench may cause deflection of trajectory of subsequently-arrived positive particles (i.e., positive ions), which can hinder the subsequently-arrived positive ions from further bombarding the bottom of the shallow trench and can increase difficulty in further etching a formed portion of the shallow trench. Thus, structure of the finally-formed shallow trench can be affected (e.g., sidewalls of the shallow trench can become tapered instead of vertical), which can affect insulation effect of the subsequently formed STI.

In view of the above problems and other problems, various embodiments provide a method for forming a shallow trench. An exemplary method can include at least one etching step to form a shallow trench in a semiconductor substrate. In addition, after each etching step, a plasma cleaning process can be performed to clean up charged particles and by-products (formed after the etching) in the formed shallow trench. The plasma can be electronegative.

During the plasma cleaning process, the plasma having a high (or strong) electronegativity can effectively capture the positive ions in the formed shallow trench and on the semiconductor substrate from the previous etching step. Thus, accumulation distribution of various different charged particles on the semiconductor substrate and in the shallow trench can be destroyed. In addition, aggregation intensity of the charged particles gathered in the shallow trench and on the semiconductor substrate based on electrical polarity and electrical potential in the reaction chamber can be reduced. Further, removal efficiency of the charged particles and the by-products trapped in the shallow trench can be increased. As a result, subsequent etching steps can be implemented in an orderly manner, the structure of the finally-formed shallow trench can be improved, and electrical leakage risks of the finally-formed STI can be suppressed.

In one embodiment, a bias voltage applied on the semiconductor substrate during the plasma cleaning process and a bias voltage applied on the semiconductor substrate during the etching step can have an opposite polarity, which can change a direction of an electric field in the reaction chamber. As a result, the charged particles gathered in the formed shallow trench during the etching step can be dispersed, a probability of capturing the charged particles by the plasma during the plasma cleaning process can be increased, and the removal efficiency of the charged particles and the by-products in the shallow trench can be increased.

Figure 17:
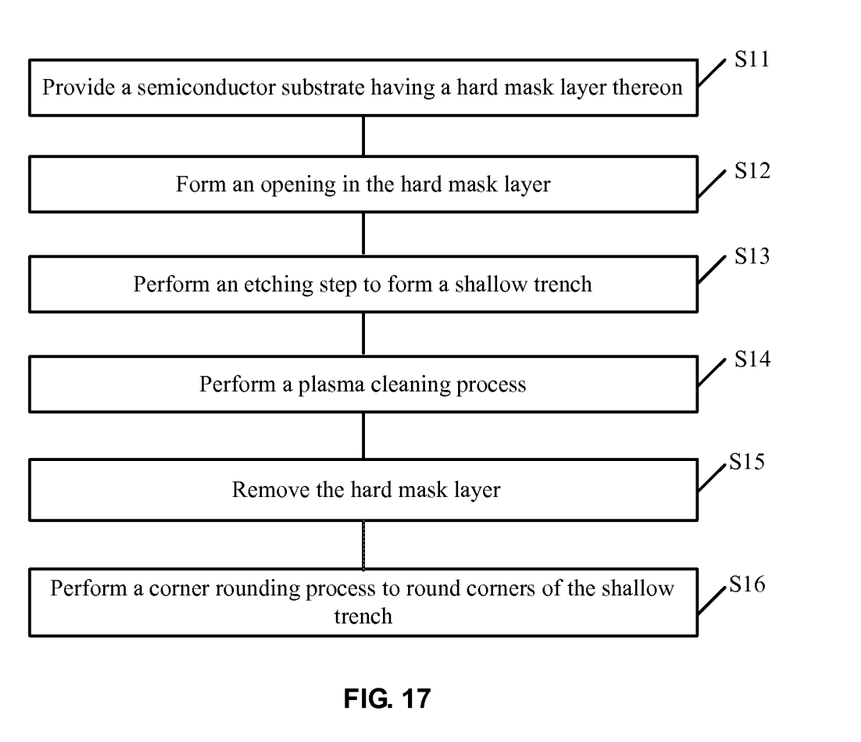
FIG. 17 depicts an exemplary method for forming a shallow trench in accordance with various disclosed embodiments.

FIG. 17 depicts an exemplary method for forming a shallow trench in accordance with various disclosed embodiments. FIGS. 1-6 depict corresponding cross-sectional views of the shallow trench at various stages during its formation in accordance with various disclosed embodiments. Note that although FIGS. 1-6 depict structures corresponding to the method depicted in FIG. 17, the structures and the method are not limited to one another in any manner.

Figure 1:
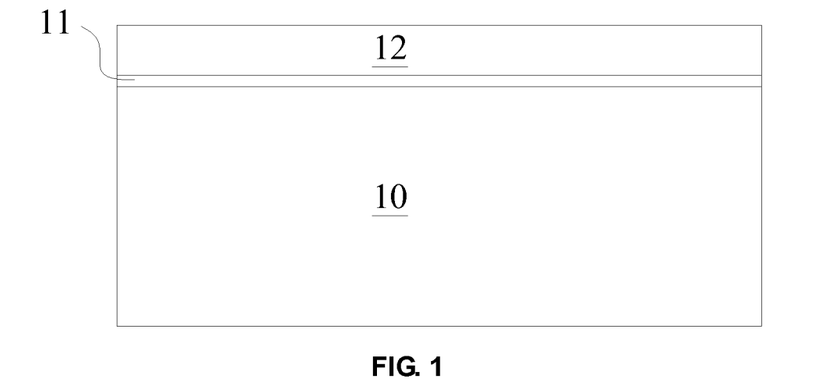
FIGS. 1-6 depict cross-sectional views of an exemplary shallow trench at various stages during its formation in accordance with various disclosed embodiments.

In Step S11 of FIG. 17 and referring to FIG. 1, a semiconductor substrate 10 is provided. The semiconductor substrate 10 can be single crystal, polycrystalline or amorphous structures of silicon, germanium, gallium arsenide and/or silicon germanium (SiGe), and can also be made of silicon-on-insulator (SOI). Alternatively, the semiconductor substrate 10 can be made of any other suitable semiconductor substrate materials.

Still referring to FIG. 1, optionally, a thermal oxide layer 11 can be formed on the semiconductor substrate 10. A hard mask layer 12 can be formed on the thermal oxide layer 11. The thermal oxide layer 11 can be formed by a thermal oxidation growth process, for example. The thermal oxide layer 11 can have a dense structure to protect the underneath semiconductor substrate 10 in subsequent processes. In one embodiment, the hard mask layer 12 can be a silicon nitride layer, and can be formed using a chemical vapor deposition (CVD) process.

Figure 2:
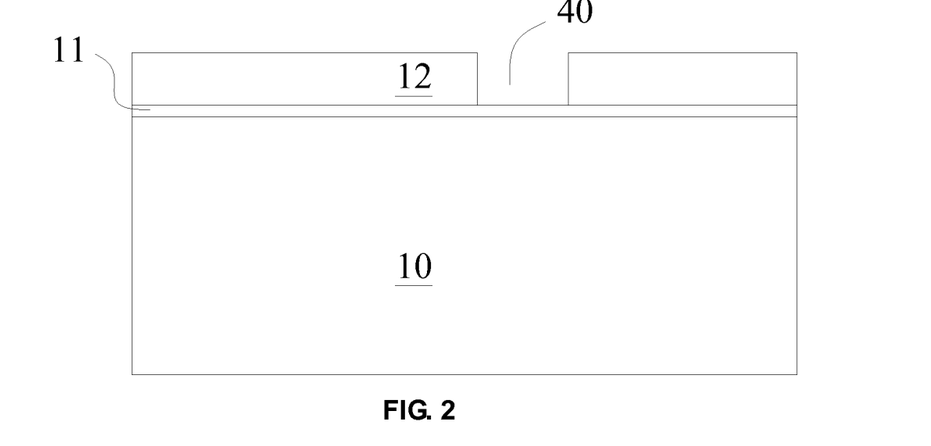
Figure 2A:
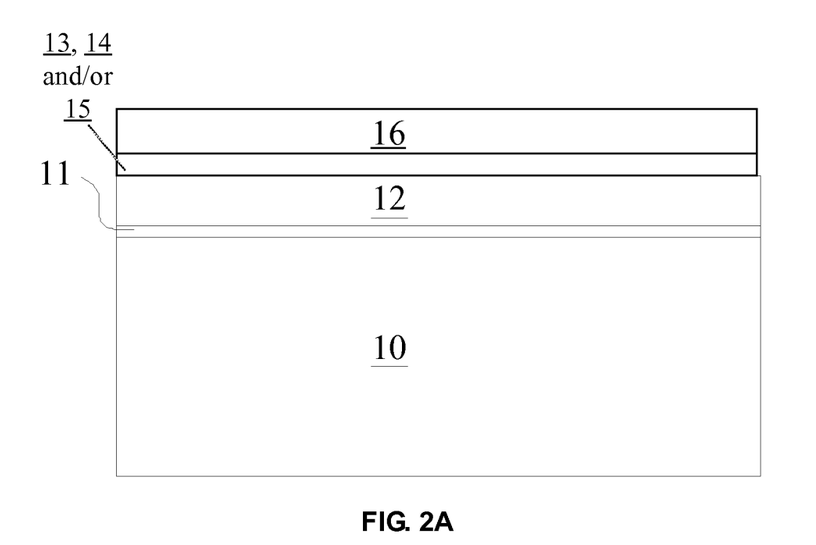

In Step S12 of FIG. 17 and referring to FIG. 2A, a photoresist layer 16 is coated on the hard mask layer 12. By an exposure process and a development process, the photoresist layer 16 can be patterned. And the hard mask layer 12 can be subsequently patterned, and an opening 40 can be formed in the hard mask layer 12 (e.g., as shown in FIG. 2). A position of the opening 40 can match a position of a shallow trench structure to be subsequently formed in the semiconductor substrate 10.

In one embodiment, optionally, before the photoresist layer 16 is coated, the hard mask layer 12 can be coated selectively with one or more of amorphous carbon layer(s) 13, dielectric anti-reflective coating (Darc) layer(s) 14 and bottom anti-reflective coating (Barc) layer(s) 15. The photoresist layer 16 can be coated (or deposited) over the hard mask layer 12 (or over any other layers coated on the hard mask layer 12).

For example, the hard mask layer 12 can be coated by the Barc layer 15, the Darc layer 14 on the Barc layer 15, and the amorphous carbon layer 13 on the Darc layer 14. The amorphous carbon layer 13 can include an advanced patterning film (APF) produced by Applied Materials, Inc. (Santa Clara, Calif.), for example.

In one embodiment, there can be a single-layer or tri-layer for patterning. In the case of a tri-layer, the tri-layer can include a low temperature oxidation (LTO) layer, a silicon anti-reflective coating and an amorphous-carbon-based coating.

Still in Step S12 of FIG. 17 and referring to FIG. 2, by exposure and development processes, the photoresist layer 16 is patterned. Next, using the patterned photoresist layer 16 as an etch mask, the hard mask layer 12 is etched (e.g. etched layer-by-layer), until a pattern in the patterned photoresist layer 16 is transferred into the hard mask layer 12.

During the exposure process of the photoresist layer, the amorphous carbon layer(s) 13, Darc layer(s) 14 and/or Barc layer(s) 15 can effectively reduce a standing wave effect and improve a contrast of a pattern formed in the photoresist layer 16. However, in some embodiments, the patterning of the hard mask layer 12 can be accomplished without forming the amorphous carbon layer(s) 13, the Darc layer(s) 14, and/or the Barc layer(s) 15, without limitation.

In various embodiments, the photoresist layer 16 and any applicable layers underneath can be removed or retained before subsequent steps. For example, to remove the photoresist layer 16 and any applicable layers underneath from the patterned hard mask layer 12, a suitable stripping process can be used. In addition, prior to etching, an optional top corner rounding (TCR) process can be performed on the patterned hard mask layer 12.

Figure 3:
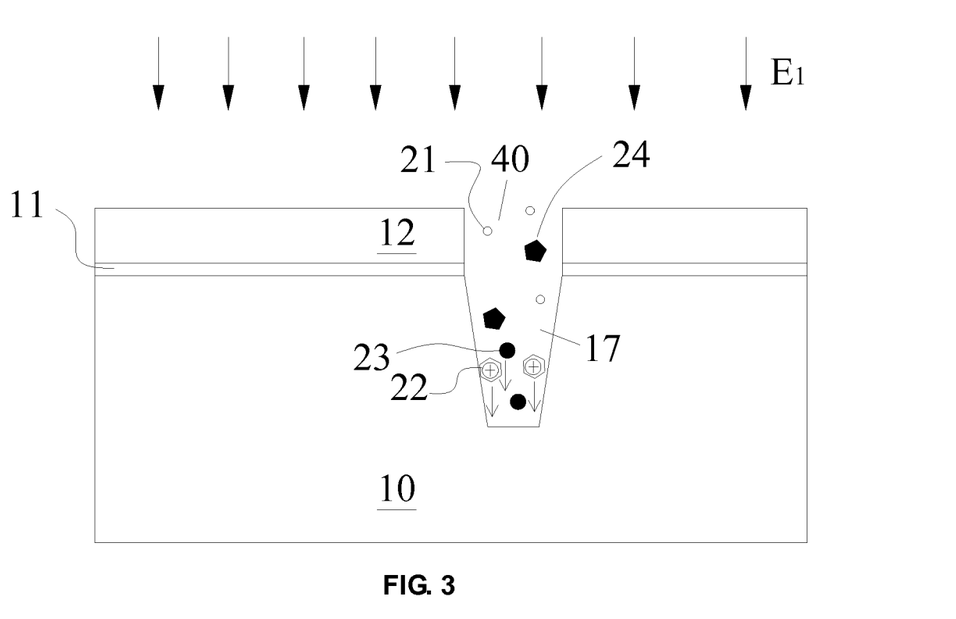

In Step S13 of FIG. 17 and referring to FIG. 3, using the hard mask layer 12 as an etch mask (as shown in FIG. 2), the thermal oxide layer 11 and the semiconductor substrate 10 are etched sequentially along the opening 40 by a reactive ion etch (RIE) process, such that a shallow trench as desired can be formed in the semiconductor substrate 10.

For example, the RIE process of etching the semiconductor substrate 10 can include the following steps. First, a radio frequency (RF) source in the reaction chamber is adjusted, to set an RF power from about 700 w to about 1500 w. A pressure is adjusted to range from about 5 mtorr to about 20 mtorr. At the same time, a bias power source is adjusted to establish a first bias voltage ranging from about 50 V to about 700 V on a surface of the semiconductor substrate 10. Next, an etching gas, e.g., including $SF_4$, is supplied into the reaction chamber. Using the hard mask layer 12 as the etch mask, the semiconductor substrate 10 is etched for a first time along the opening 40, to form a shallow trench 17.

Still referring to FIG. 3, during the etching process, electrons 21 generated under a high-frequency electric field can collide with the exemplary $SF_4$ supplied into the reaction chamber. Thus, each $SF_4$ can be decomposed into a $SF_3^+$ ion 22, a free fluorine (F) radical 23, and an electron $e^-$ (not shown). The fluorine (F) radicals 23 can etch (e.g., corrode) an exposed surface of the semiconductor substrate 10 along the opening 40. At the same time, under an electric field formed by the first bias voltage on the surface of the semiconductor substrate 10, the $SF_3^+$ ions 22 can bombard the exposed surface of the semiconductor substrate 10 along the opening 40. With the $SF_3^+$ ions 22 and fluorine (F) radicals 23 acting together, the shallow trench 17 can be formed in the semiconductor substrate 10.

In one embodiment, the etching gas may include one or more of HRr, HBr, $Cl_2$, $SF_3$, $O_2$, and $N_2$, and/or any other suitable etching gases for RIE etching processes. In addition, during the etching step, a carrier gas including He and/or Ar can be supplied at the same time. The gas He can be used as a dilution gas, which can effectively improve etching uniformity, and thus improve stability and safety of the etching process. The gas Ar can effectively increase bombardment energy of the etching gas to improve dry etching rate.

However, under an electric field E1 formed by the first bias voltage on the semiconductor substrate 10 and by an RF voltage in the reaction chamber, charged particles in the reaction chamber can accumulate at various portions of the shallow trench 17 respectively, according to electrical polarities. For example, positive ions (charged positively), e.g., the $SF_3^+$ ions 22, may tend to accumulate at the bottom of the shallow trench 17, and electrons, e.g., electrons 21 (charged negatively) may tend to accumulate at the top of the shallow trench 17. Thus, a positive-charge region can be formed at the bottom of the shallow trench 17, and a negative-charge region can be formed at the top of the shallow trench 17.

Therefore, during subsequent further etching process(es), based on the repulsion nature between charged particles (of the same polarity, e.g., the electrons), trajectory of the $SF_3^+$ ions 22 can be deflected, which can increase difficulty for the $SF_3^+$ ions 22 in further bombarding the bottom of the shallow trench 17 for further etching. As a result, structure of the finally-formed shallow trench 17 can be affected. In addition, during the etching process, by-products 24 can be produced at the same time. The charged particles can be adsorbed on the by-products 24, thus making the by-products 24 firmly adsorbed on inner walls of the shallow trench 17.

Figure 4:
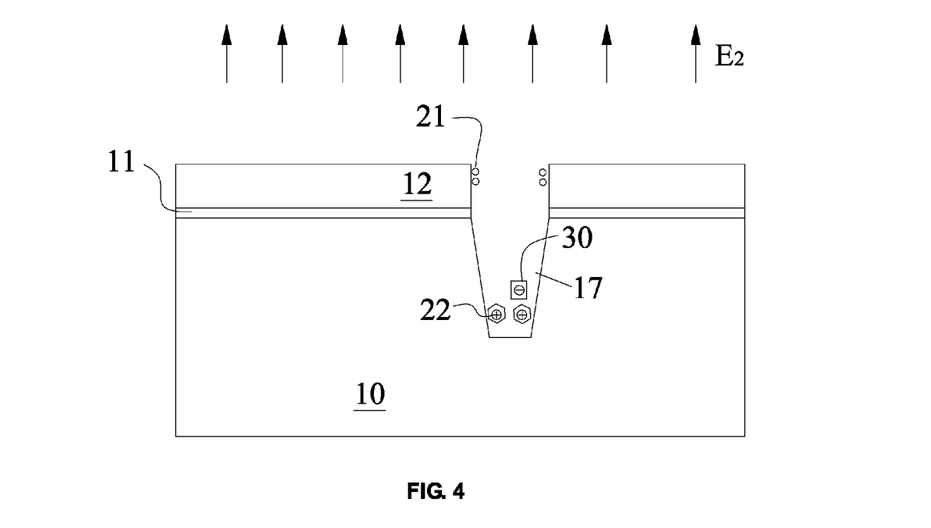

FIG. 4 depicts a cross-sectional view of the exemplary shallow trench during a plasma cleaning process after the etching step (e.g., as shown in FIG. 3). In Step S14 of FIG. 17 and referring to FIG. 4, after the etching process, a cleaning gas is supplied into the reaction chamber. In various embodiments, the cleaning gas does not react with the semiconductor substrate 10. The cleaning gas can be excited into a plasma gas (i.e., a plasma state) under the RF condition. Thus, the plasma cleaning process can be performed to remove the charged particles (e.g., the positive ions and the negative ions) and the by-products 24 (generated during the etching process) on the semiconductor substrate 10 and in the shallow trench 17.

For example, the plasma cleaning process can include the following steps. First, the RF source in the reaction chamber is adjusted, to set the RF power from about 200 w to about 1500 w. The pressure is adjusted to range from about 5 mtorr to about 100 mtorr. Next, the cleaning gas that does not react with the semiconductor substrate 10 is supplied into the reaction chamber, in order to remove the by-products 24 in the reaction chamber.

In one embodiment, the cleaning gas can include a gas mixture containing at least one of CO, and $CO_2$. For example, the cleaning gas can include a mixed gas of CO and $CO_2$. In this case, after being supplied into the reaction chamber, under the RF condition, the mixed gas of CO and $CO_2$ can be excited into a plasma 30 (also referred to as a cleaning plasma 30) that can have a strong electronegativity. For example, the plasma 30 can include strongly electronegative plasma-state particles including, for example, particles that can be formed by decomposing CO and/or $CO_2$ under the RF condition, e.g., $O^{2-}$ or other ions.

The plasma 30 can effectively capture the positive ions. In one embodiment, after the cleaning gas is supplied into the reaction chamber and excited into the plasma 30, the plasma 30 can enter the shallow trench 17 and reach the bottom of the shallow trench 17, thus neutralizing the positive charges (e.g. the $SF_3^+$ ions 22) in the shallow trench 17. The plasma 30 can effectively capture the positive ions at the bottom of the shallow trench 17, and can carry the positive ions out of the shallow trench 17 and into the reaction chamber based on airflow (e.g., the airflow of the cleaning gas and/or the plasma 30).

At the same time, after the positive ions are removed, balance of electric charge distribution on the semiconductor substrate 10 and in the shallow trench 17 can be broken. Thus, the accumulation of electrons at the top of the shallow trench 17 can be reduced (in other words, a force to accumulate electrons can be reduced). The electrons can then be removed from the reaction chamber with the airflow (e.g., the airflow of the cleaning gas).

In one embodiment, a flow of the plasma 30 can range from about 20 sccm to about 2000 sccm, or from about 100 sccm to about 500 sccm. In one embodiment, the flow of the plasma 30 can be adjusted by regulating a flow of the cleaning gas. In one embodiment, in the cleaning gas containing CO and $CO_2$, a flow ratio of CO and $CO_2$ (or $CO/CO_2$) can range from about 2:3 to about 3:2.

In one embodiment, during the plasma cleaning process, the bias power source can be adjusted to establish a second bias voltage. The second bias voltage can have an opposite polarity to the first bias voltage established on the surface of the semiconductor substrate 10 during the etching process. In another embodiment, the second bias voltage on the surface of the semiconductor substrate 10 can be directly adjusted to be about 0 V. For example, the second bias voltage can range from about −500 to about 0 V.

As shown in FIG. 4, based on the second bias voltage on the surface of the semiconductor substrate 10, an electric field E2 can be formed above the semiconductor substrate 10. The electric field E2 can be in an opposite direction to the electric field E1 formed during the etching process. The second bias voltage can change electric potential profile above the semiconductor substrate 10, and can thus drive the charged particles (including, e.g., the positive ions at the bottom of the shallow trench 17, and the electrons at the top of the shallow trench 17) to move, such that the originally-accumulated charged particles can be dispersed.

After the charged particles are dispersed, efficiency of capturing the positive ions by the plasma 30 can be improved. Setting the second bias voltage can prevent the various charged particles from firmly accumulating in the shallow trench 17 or on the semiconductor substrate 10, where the accumulating can be based on the respective electrical polarities and the electric field (e.g., E1) formed in the reaction chamber by the first bias voltage during the etching process. As a result, efficiency of removing the by-products (e.g., the by-products 24) and the charged particles in the reaction chamber can be improved.

In various embodiments, parameters and durations of each etching step and each plasma cleaning process can be correspondingly adjusted according practical needs. For example, a duration ratio of the plasma cleaning process to the etching step can range from about 1:2 to about 1:1. When this duration ratio is less than about 1:2, there may be insufficient cleaning, and many of the charged particles and the by-products can remain on the semiconductor substrate 10 and in the shallow trench 17, which can result in electrical leakage risks in the subsequently-formed STI. On the other hand, when this duration ratio is more than about 1:1, there may be a waste of the plasma (i.e., the plasma 30), which can increase cost of the plasma cleaning process.

Figure 5:
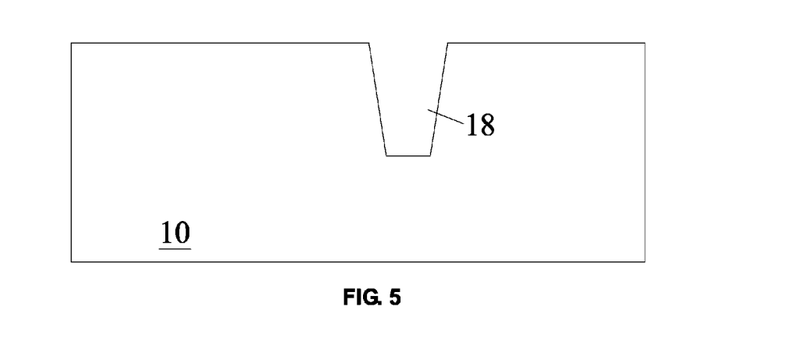

In Step S15 of FIG. 17 and referring to FIG. 5, optionally, after the cleaning process is completed, the thermal oxidation layer 11 and the hard mask layer 12 formed above the semiconductor substrate 10 are removed from the substrate 10 to form a shallow trench 18 (also referred to as a depth-defining shallow trench 18).

Figure 6:
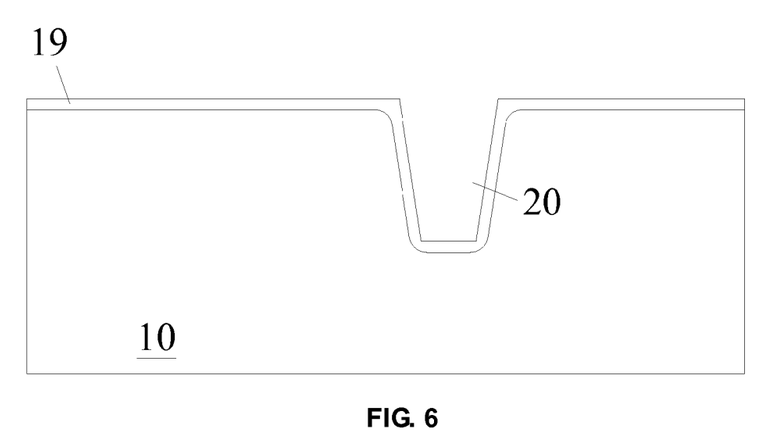

In Step S16 of FIG. 17 and referring to FIG. 6, optionally, a corner rounding process is used to round corners at the top and the bottom of the shallow trench 18 to form rounded corners in the shallow trench 18.

For example, a thermal oxidation process can be implemented on the semiconductor substrate 10 after the shallow trench 18 is formed. A thermal oxide layer 19 (also referred to as a corner-rounding thermal oxide layer 19) can thus be formed on the surface of the semiconductor substrate 10 and on inner walls of the shallow trench 18. In one embodiment, the corner rounding process can be a suitable bottom rounding (BR) process.

In this case, during the thermal oxidation process, the oxidation rate at sharp corner portions of the shallow trench 18 can be faster than the oxidation rate at other portions of the shallow trench 18. Consumption of the material of the semiconductor substrate 10 (e.g., silicon) can be the greatest at the sharp corner portions. After the thermal oxidation layer 19 is formed, the thermal oxidation layer 19 can be removed by a wet etching process, and the material of the semiconductor substrate 10 at the sharp corner portions can be removed most. Thus, at the sharp corner portions (e.g., the top and the bottom of the shallow trench 18), rounded (or curved) corners can be formed. A shallow trench 20 (or a rounded shallow trench 20) can thus be formed. During subsequent semiconductor fabrication processes, possibility of charged particles (e.g., electrons) accumulating at the corner portions (i.e., corners) of the shallow trench 20 can be effectively reduced. As a result, electrical isolation properties of the subsequently-formed STI can be improved.

Figure 18:
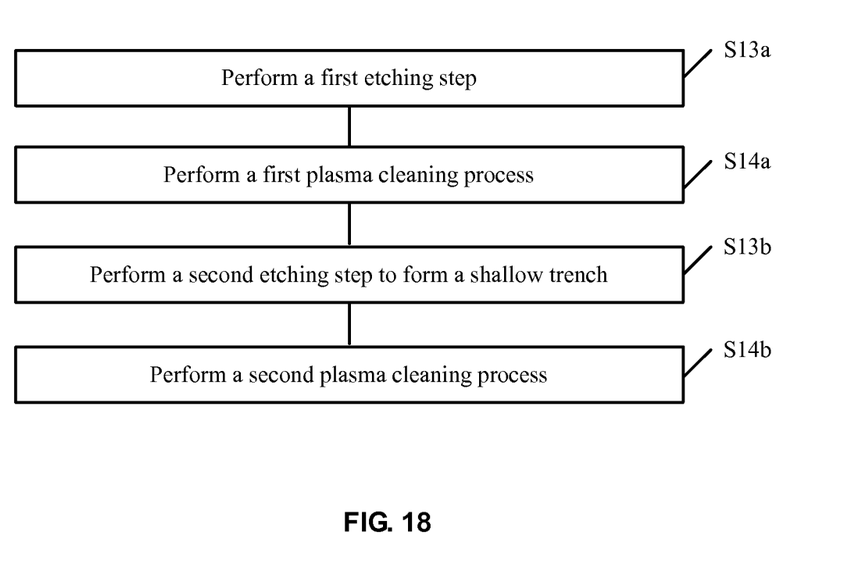
FIG. 18 depicts another exemplary method for forming a shallow trench in accordance with various disclosed embodiments.

FIG. 18 depicts another exemplary method for forming a shallow trench in accordance with various disclosed embodiments. FIGS. 7-10 depict corresponding cross-sectional views of the shallow trench at various stages during its formation in accordance with various disclosed embodiments. Note that although FIGS. 7-10 depict structures corresponding to the method depicted in FIG. 18, the structures and the method are not limited to one another in any manner.

In this embodiment, a hard mask layer 12 and a thermal oxide layer 11 can be formed on a semiconductor substrate 10, the hard mask layer 12 can be patterned, and an opening 40 can be first formed in a hard mask layer 12 using the same or similar steps as depicted above, e.g., as shown in FIGS. 1-2 and/or in Steps S11-S12 of FIG. 17.

During the formation of a shallow trench, two etching steps can be included. In addition, after each etching step, a plasma cleaning process can be used to clean the formed shallow trench, in order to remove by-products and charged particles formed during the etching step. For example, a method of forming the shallow trench can include the following steps.

Figure 7:
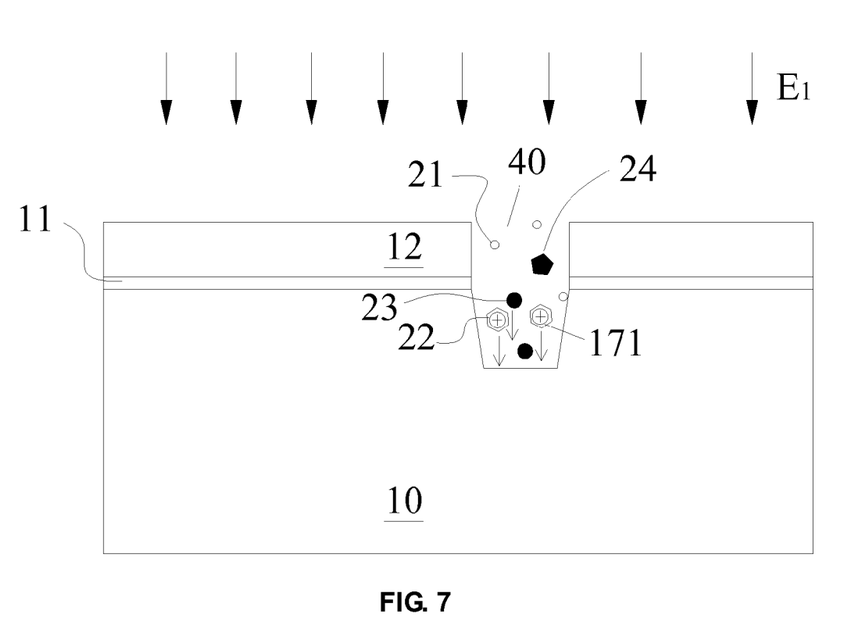
FIGS. 7-10 depict cross-sectional views of another exemplary shallow trench at various stages during its formation in accordance with various disclosed embodiments.

In Step S13a of FIG. 18 and referring to FIG. 7, a first etching step is performed. An etching gas can be supplied into a reaction chamber. Using the hard mask layer 12 as an etch mask, a semiconductor substrate 10 is etched along the opening 40 to form a first shallow trench 171.

For example, during the first etching step, an etching gas, e.g., including $SF_4$, can be supplied into the reaction chamber. Electrons 21 generated under a high-frequency electric field can collide with the $SF_4$ supplied into the reaction chamber. Thus, each $SF_4$ can be decomposed into a $SF_3^+$ ion 22, a free fluorine (F) radical 23, and an electron $e^-$ (not shown). By-products 24 can be produced at the same time.

Figure 8:
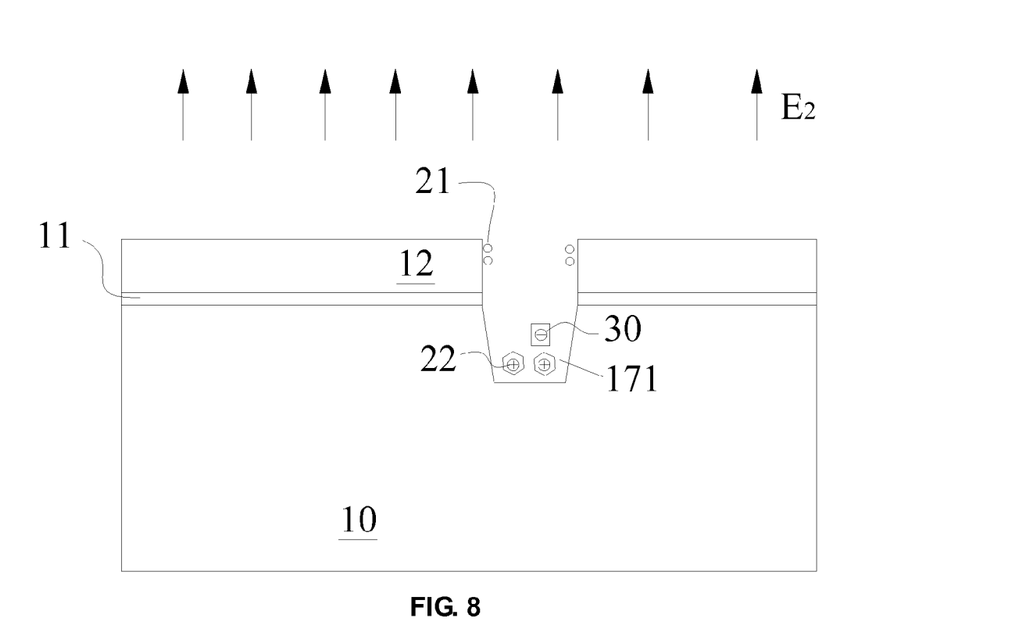

In Step S14a of FIG. 18 and referring to FIG. 8, after the first etching step, a first plasma cleaning process is performed on the first shallow trench 171 and the semiconductor substrate 10. For example, a cleaning gas can be supplied into the reaction chamber to perform the first plasma cleaning process in order to remove the by-products 24 and the charged particles (e.g., the $SF_3^+$ ions 22, and the electrons 21) formed during the first etching step and accumulated on the semiconductor substrate 10 and in the first shallow trench 171.

During the cleaning process, the cleaning gas can be excited into a plasma 30 that can have a strong electronegativity. The plasma 30 can remove the charged particles, such as the positive ions (e.g. the $SF_3^+$ ions 22) and the electrons (e.g., the electrons 21), and remove the by-products 24.

Figure 9:
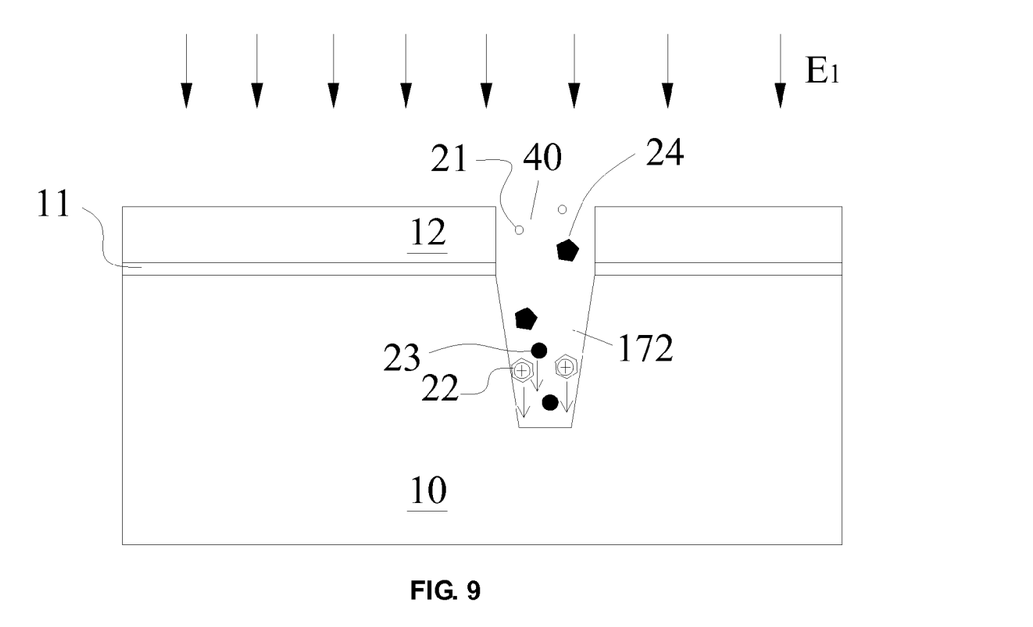

In Step S13b of FIG. 18 and referring to FIG. 9, after the first plasma cleaning process, a second etching step is performed. Continuing to use the hard mask layer 12 as the etch mask, the semiconductor substrate 10 is further etched along the opening 40 based on the first shallow trench 171 to form a second shallow trench 172.

Figure 10:
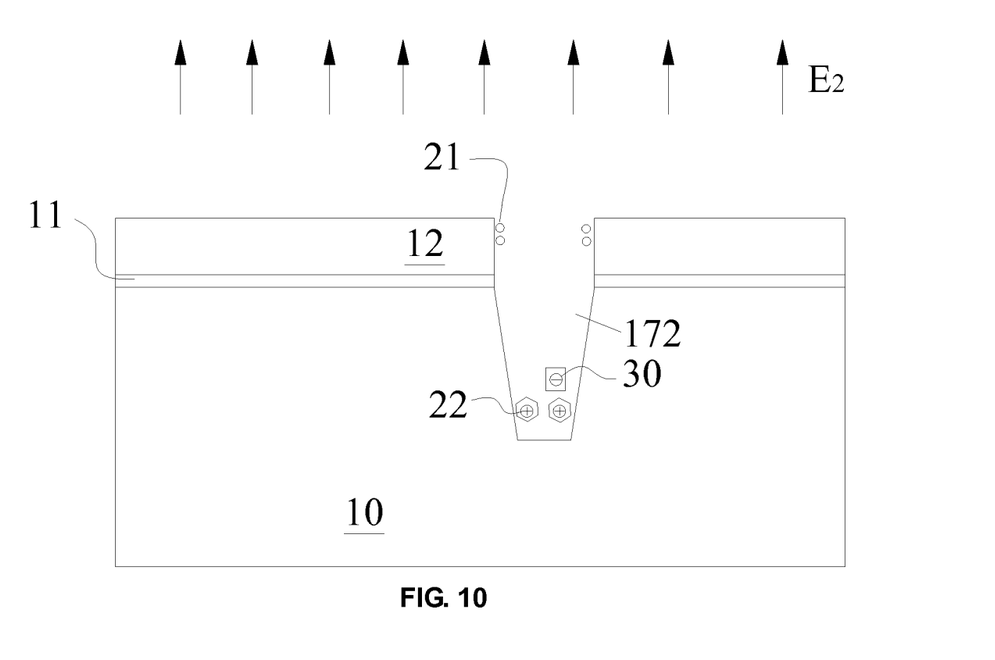

In Step S14b of FIG. 18 and referring to FIG. 10, after the second shallow trench 172 is formed, a second plasma cleaning process is performed on the second shallow trench 172 and the semiconductor substrate 10, in order to remove the by-products 24 and the charged particles in the reaction chamber that accumulate on the semiconductor substrate 10 and in the second shallow trench 172.

The first etching step and the second etching step can be similar to or the same as the above-depicted etching step including, e.g., the Step S13 as shown in FIG. 17. The first plasma cleaning process and the second plasma cleaning process can be similar to or the same as the above-depicted plasma cleaning process including, e.g., the Step S14 as shown in FIG. 17.

During an etching step (e.g., the first etching step, the second etching step, etc.), a positive bias voltage can be formed on the surface of the semiconductor substrate 10, as depicted above in various embodiments (e.g., in FIG. 3). Based on the bias voltage, an electric field E1 can be formed above the semiconductor substrate 10. Because of the existence of the electric field E1, positive ions 22 in the reaction chamber may mostly accumulate at a bottom of the first shallow trench 171, and negative ions and/or electrons may accumulate at a top of the first shallow trench 171. Because of the repulsion between particles of the same electrical polarity (and attraction between particles of opposite electrical polarity), after the first etching step, the positive ions accumulated in the formed first shallow trench 171 can change bombardment trajectory of positive ions in subsequent RIE process (es). As a result, structure of the finally-formed shallow trench can be affected, which can affect electrical isolation properties of the subsequently-formed STI.

In this embodiment, after the first etching step, the charged particles and the by-products 24 accumulated on the semiconductor substrate 10 and in the first shallow trench 171 can be timely and effectively removed using the first plasma cleaning process (including, e.g., forming an electric field E2 having an opposite polarity to the electric field E1). Thus, desirable etching conditions can be created for the second etching step, which can ensure desired structure of the finally-formed shallow trench 18 (e.g., as shown in FIG. 5).

Optionally, in subsequent steps, the hard mask layer 12 and the thermal oxidation layer 11 can be removed, and a corner rounding process can be performed on the formed shallow trench 18 (e.g., as shown in Steps S15-S16 in FIG. 17).

Figure 19:
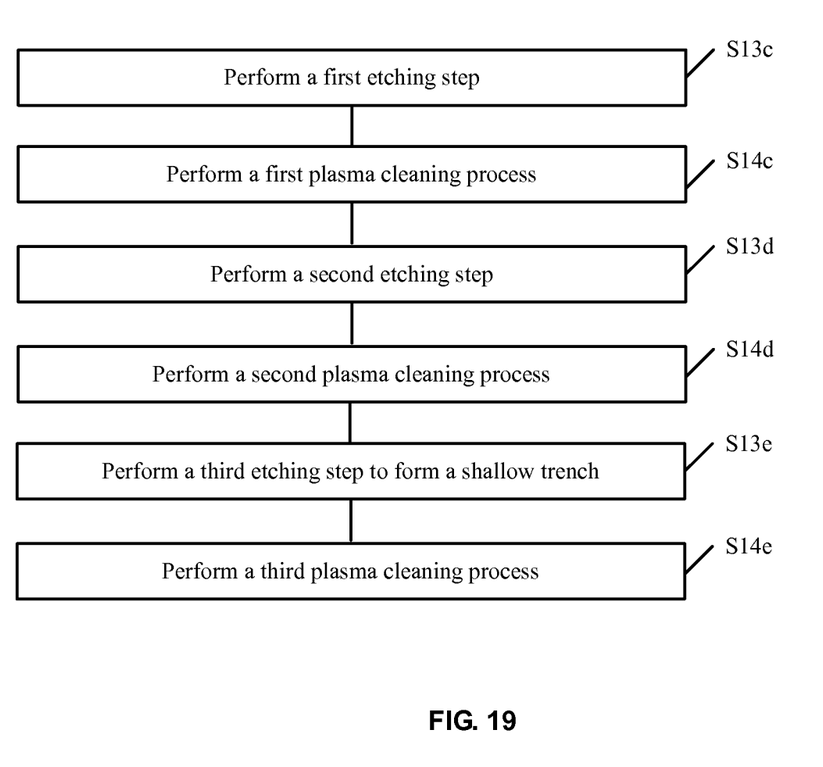
FIG. 19 depicts yet another exemplary method for forming a shallow trench in accordance with various disclosed embodiments.

FIG. 19 depicts yet another exemplary method for forming a shallow trench in accordance with various disclosed embodiments. FIGS. 11-16 depict corresponding cross-sectional views of the shallow trench at various stages during its formation in accordance with various disclosed embodiments. Note that although FIGS. 11-16 depict structures corresponding to the method depicted in FIG. 19, the structures and the method are not limited to one another in any manner.

In this embodiment, a hard mask layer 12 and a thermal oxide layer 11 can be formed on a semiconductor substrate 10, the hard mask layer 12 can be patterned, and an opening 40 can be first formed in a hard mask layer 12 using the same or similar steps as depicted above, e.g., as shown in FIGS. 1-2 or in Steps S11-S12 of FIG. 17.

During the formation of a shallow trench, three etching steps can be included. In addition, after each etching step, a plasma cleaning process can be used to clean the formed shallow trench, in order to remove by-products and charged particles formed during each respective etching step. For example, a method of forming the shallow trench can include the following steps.

Figure 11:
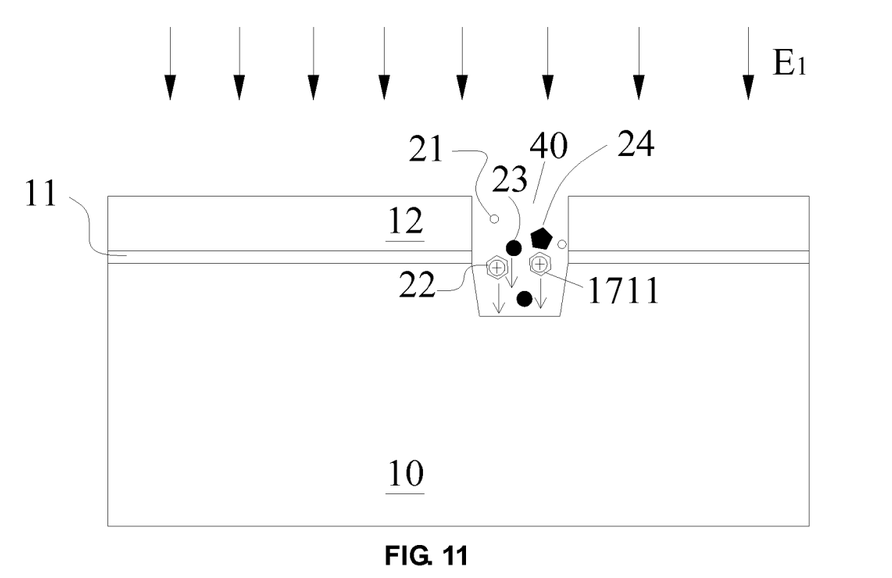
FIGS. 11-16 depict cross-sectional views of yet another exemplary shallow trench at various stages during its formation in accordance with various disclosed embodiments.

In Step S13c of FIG. 19 and referring to FIG. 11, using the hard mask layer 12 as an etch mask, a first etching step is performed to etch a semiconductor substrate 10 along the opening 40 to form a third shallow trench 1711.

For example, during the first etching step, an etching gas, e.g., including $SF_4$, can be supplied into the reaction chamber. Electrons 21 generated under a high-frequency electric field can collide with the $SF_4$ supplied into the reaction chamber. Thus, each $SF_4$ can be decomposed into a $SF_3^+$ ion 22, a free fluorine (F) radical 23, and an electron $e^-$ (not shown). By-products 24 can be produced at the same time. An electric field E1 can be formed above the semiconductor substrate 10.

Figure 12:
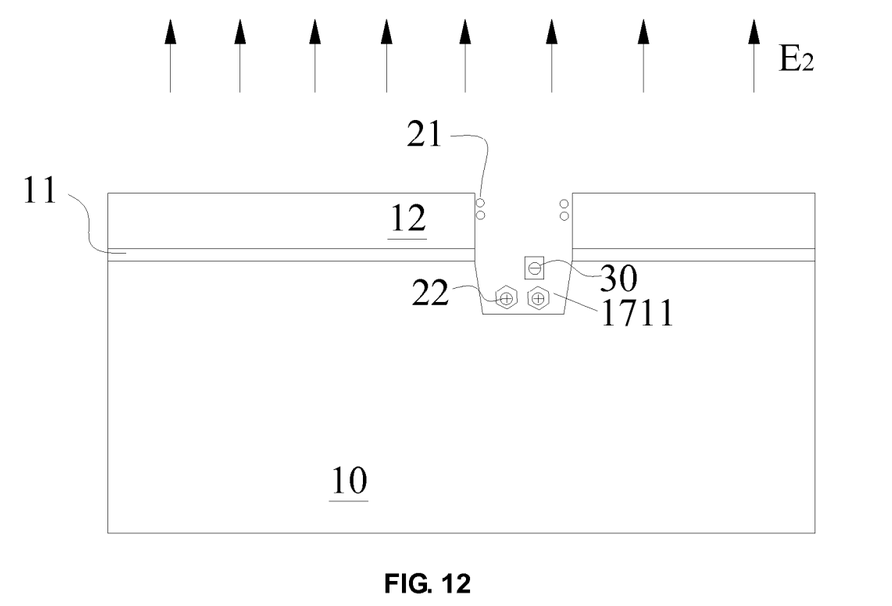

In Step S14c of FIG. 19 and referring to FIG. 12, a first plasma cleaning process is performed on the third shallow trench 1711 and the semiconductor substrate 10 to remove the by-products and the charged particles in the third shallow trench 1711 and on the semiconductor substrate 10.

For example, during the cleaning process, the cleaning gas can be excited into a plasma 30 that can have a strong electronegativity. The plasma 30 can remove the charged particles, such as the positive ions (e.g. the $SF_3^+$ ions 22) and the electrons (e.g., the electrons 21), and remove the by-products 24. An electric field E2 (which can have an opposite polarity to the electric field E1) can be formed above the semiconductor substrate 10.

Figure 13:
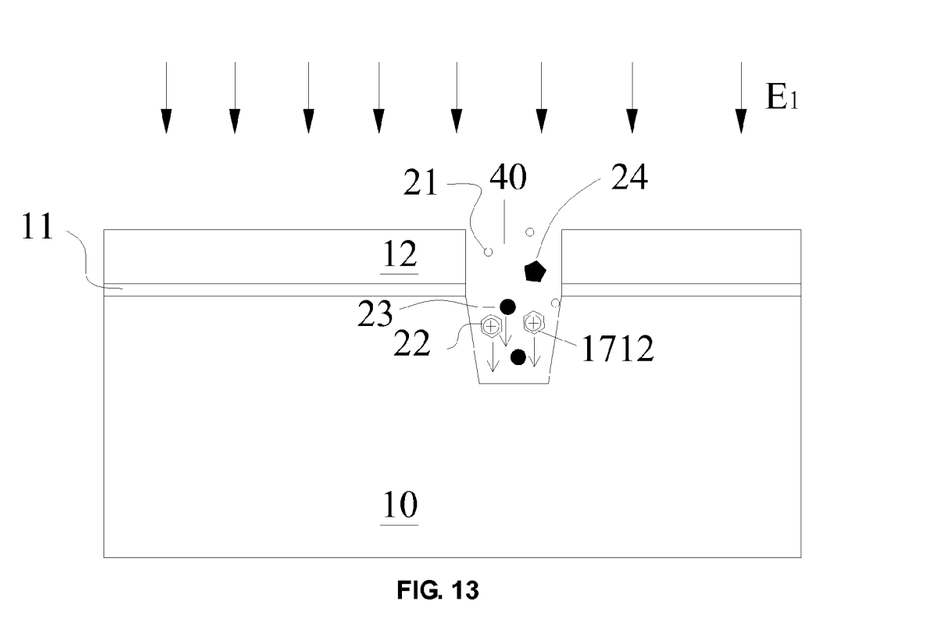

In Step S13d of FIG. 19 and referring to FIG. 13, after the first plasma cleaning process, based on the third shallow trench 1711, a second etching step is performed to etch the semiconductor substrate 10 to form a fourth shallow trench 1712.

Figure 14:
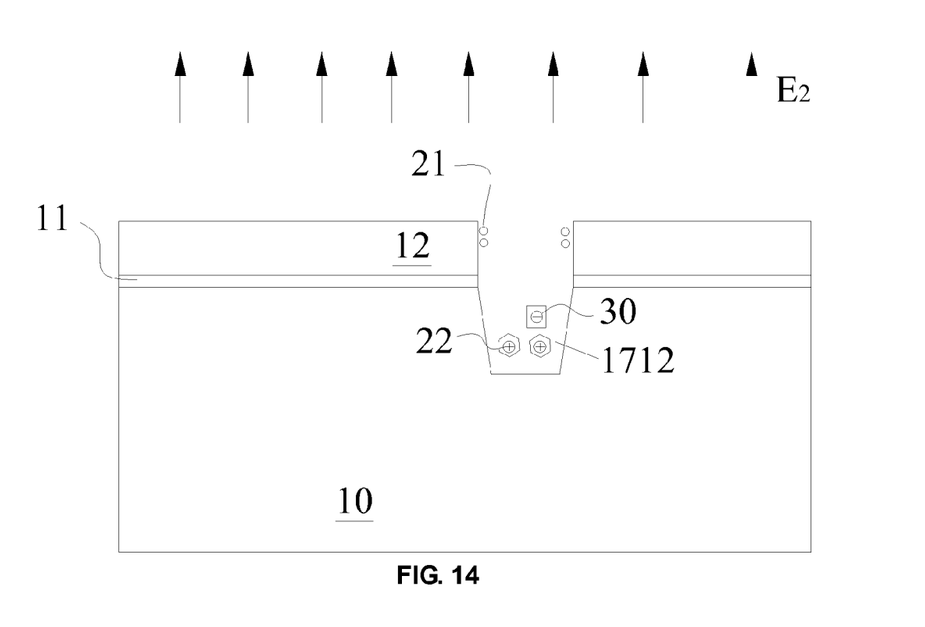

In Step S14d of FIG. 19 and referring to FIG. 14, a second plasma cleaning process is performed on the fourth shallow trench 1712 and the semiconductor substrate 10.

Figure 15:
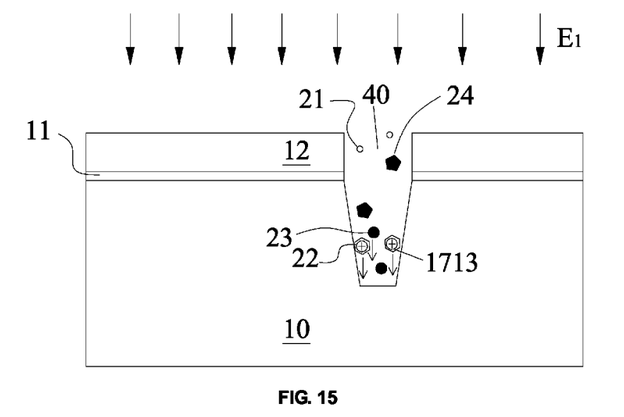

In Step S13e of FIG. 19 and referring to FIG. 15, after the second plasma cleaning process, based on the fourth shallow trench 1712, a third etching step is performed to etch the semiconductor substrate 10 to form a fifth shallow trench 1713.

Figure 16:
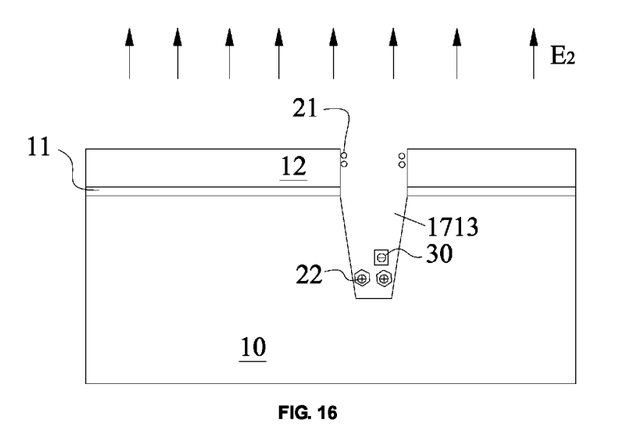

In Step S14e of FIG. 19 and referring to FIG. 16, after the third etching step, a third plasma cleaning process is performed on the fifth shallow trench 1713 and the semiconductor substrate 10 to remove the by-products and the charged particles in the third shallow trench 1713 and on the semiconductor substrate 10.

The first, second and third etching steps can be similar to or the same as the above-depicted etching step in various disclosed embodiments (e.g., Step S13 as shown in FIG. 17). The first, second and third plasma cleaning processes can be similar to or the same as the above-depicted plasma cleaning process in various disclosed embodiments (e.g., Step S14 as shown in FIG. 17).

Optionally, in subsequent steps, the hard mask layer 12 and the thermal oxidation layer 11 can be removed, and a corner rounding process can be performed. (e.g., as shown in Steps S15-16 in FIG. 17).

It should be noted that, various disclosed embodiments provide the methods including one etching step and one step plasma cleaning process, or two etching steps and two plasma cleaning processes, or three etching steps and three plasma cleaning processes, and so on. According to various embodiments, the methods of forming a shallow trench is not limited by the examples depicted above.

For example, according to practical needs, N times of etching processes or steps (e.g., N≥1 or N≥2, or N≥3) can be used to form a shallow trench in the semiconductor substrate 10. In addition, after each etching step, a plasma cleaning process can be used to remove charged particles and by-products accumulated on the semiconductor substrate 10 and in the formed shallow trench during a previous etching step. Thus, an etch-cleaning step can be formed, which can include the N times of etching steps and N times of plasma cleaning processes each following a previous etching step.

In addition, each of the N times of etching steps can be performed using the same or different conditions (e.g., by controlling parameters such as etching gas, voltage, power, duration, pressure, etc.), with no limitation. Each of the N times of plasma cleaning processes can be performed using the same or different conditions (e.g., by controlling parameters such as etching gas, voltage, power, duration, pressure, etc.), with no limitation.

In one embodiment, an etching step can have a duration ranging from about 5 seconds to about 30 seconds. A plasma cleaning process can have a duration ranging from about 3 seconds to about 20 seconds. In this case, a desired etching rate may be ensured and, at the same time, it can be ensured that the by-products and the charged particles can be highly effectively removed by the plasma cleaning process. Thus, the structure of the finally-formed shallow trench and the properties of the subsequently-formed STI can be ensured.

In one embodiment, optionally, there can be a transition step between an etching step and a following plasma cleaning process. The transition step can be in a continuous plasma mode, where the RF power source can be configured such that plasma generation can be continuous in the reaction chamber.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a shallow trench, comprising:
providing a semiconductor substrate;
providing a mask layer on the semiconductor substrate; and
performing an etch-cleaning process including:
    etching the semiconductor substrate to form a shallow trench by one or more etching steps using the mask layer as an etch mask, wherein during each etching step of the one or more etching steps, an etching gas is excited into an etching plasma, and positive ions in the etching plasma are accumulated at a bottom of the shallow trench; and
    performing a plasma cleaning process after each etching step of the one or more etching steps, wherein the plasma cleaning process captures the positive ions and carries the positive ions out of the shallow trench by exciting a mixed gas into an electronegative plasma containing negative ions, and the mixed gas contains at least one of CO and $CO_2$.

2. The method of claim 1, wherein the plasma cleaning process includes:
supplying the mixed gas containing CO and $CO_2$, a flow ratio of CO and $CO_2$ ranging from about 2:3 to about 3:2; and
exciting the mixed gas into the plasma under a radio frequency (RF) condition.

3. The method of claim 2, wherein the RF condition includes a power ranging from about 200 w to about 1500 w and a pressure ranging from about 5 mtorr to about 100 mtorr.

4. The method of claim 1, wherein a flow of the plasma ranges from about 20 sccm to about 2000 sccm.

5. The method of claim 1, wherein:
an etching step of the one or more etching steps has a duration ranging from about 5 seconds to about 30 seconds;
the plasma cleaning process has a duration ranging from about 3 seconds to about 20 seconds; and
a ratio of the duration of the etching step to the duration of the plasma cleaning process after the etching process ranges from about 1:1 to about 2:1.

6. The method of claim 1, wherein the plasma cleaning process is performed under a second bias voltage applied on a surface of the semiconductor substrate.

7. The method of claim 6, wherein the second bias voltage ranges from about −500V to about 0 V.

8. The method of claim 6, wherein the each of the one or more etching steps includes:
supplying the etching gas into a reaction chamber including the semiconductor substrate;
exciting the etching gas into the etching plasma; and
etching the semiconductor substrate by the etching plasma under a first bias voltage applied on the surface of the semiconductor substrate, using the mask layer as the etch mask.

9. The method of claim 8, wherein the first bias voltage and the second bias voltage have an opposite electrical polarity.

10. The method of claim 9, wherein the first bias voltage ranges from about 50 V to about 700 V.

11. The method of claim 8, wherein the each etching step of the one or more etching steps has an RF source power ranging from about 700 w to about 1500 w, and a pressure ranging from about 5 mtorr to about 20 mtorr.

12. The method of claim 8, wherein the etching gas includes HBr, $Cl_2$, $SF_4$, $SF_3$, $O_2$, $N_2$, or a combination thereof.

13. The method of claim 8, wherein the each etching step of the one or more etching steps further includes:
supplying a carrier gas containing He, Ar, or a combination thereof.

14. The method of claim 1, wherein the one or more etching steps include one etching step, and the plasma cleaning process is performed after the one etching step.

15. The method of claim 1, wherein the one or more etching steps include two etching steps, and the two etching steps include a first etching step and a second etching step, and wherein the etch-cleaning process includes:
performing the first etching step;
performing a first plasma cleaning process;
performing the second etching step on the semiconductor substrate to form the shallow trench; and
performing a second plasma cleaning process.

16. The method of claim 1, wherein the one or more etching steps include three etching steps, and the three etching steps include a first etching step, a second etching step, and a third etching step, wherein the etch-cleaning process includes:
performing the first etching step;
performing a first plasma cleaning process;
performing the second etching step;
performing a second plasma cleaning process;
performing the third etching step on the semiconductor substrate to form the shallow trench; and
performing a third plasma cleaning process.

17. The method of claim 8, further including:
a transition step between an etching step of the one or more etching steps and the plasma cleaning process following the etching step, wherein the transition step is in a continuous plasma mode, and has an RF power source configured such that plasma generation is continuous in the reaction chamber.

18. The method of claim 12, wherein the etching gas includes $SF_4$, the accumulated positive ions include $SF_3^+$ ions, and the negative ions capturing the $SF_3^+$ ions include $O^{2-}$ ions.

* * * * *